(12) United States Patent
Lin

(10) Patent No.: US 8,502,207 B2
(45) Date of Patent: Aug. 6, 2013

(54) ORGANIC LIGHT EMITTING DIODE STRUCTURE HAVING LIGHT-EMITTING, HOLE TRANSPORT LAYER AND FABRICATING METHOD THEREOF

(75) Inventor: Cheng-Hung Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 152 days.

(21) Appl. No.: 12/948,783

(22) Filed: Nov. 18, 2010

(65) Prior Publication Data

US 2011/0278612 A1 Nov. 17, 2011

(30) Foreign Application Priority Data

May 13, 2010 (TW) .............................. 99115319 A

(51) Int. Cl.
*H01L 29/08* (2006.01)
*H01L 35/24* (2006.01)
*H01L 51/00* (2006.01)
*H01L 33/00* (2010.01)
*H01L 51/40* (2006.01)
*H01J 1/62* (2006.01)
*H01J 63/04* (2006.01)

(52) U.S. Cl.
USPC ........ 257/40; 257/98; 257/E51.022; 313/502; 313/504; 438/99

(58) Field of Classification Search
None
See application file for complete search history.

(56) References Cited

U.S. PATENT DOCUMENTS

| | | | | |
|---|---|---|---|---|
| 6,967,062 | B2 * | 11/2005 | Hatwar et al. | 428/690 |
| 2005/0040392 | A1 * | 2/2005 | Wu et al. | 257/40 |
| 2005/0280355 | A1 | 12/2005 | Lee et al. | |
| 2008/0136321 | A1 * | 6/2008 | Do et al. | 313/504 |
| 2008/0258611 | A1 | 10/2008 | Su et al. | |
| 2008/0290791 | A1 * | 11/2008 | Lee et al. | 313/504 |
| 2009/0045739 | A1 * | 2/2009 | Kho et al. | 313/504 |
| 2009/0243466 | A1 * | 10/2009 | Yokoyama et al. | 313/502 |
| 2010/0090241 | A1 * | 4/2010 | D'Andrade et al. | 257/98 |

FOREIGN PATENT DOCUMENTS

| | | |
|---|---|---|
| CN | 1780510 A | 5/2006 |
| CN | 101055922 A | 10/2007 |

* cited by examiner

*Primary Examiner* — Michael Jung

(74) *Attorney, Agent, or Firm* — CKC & Partners Co., Ltd.

(57) ABSTRACT

An organic light emitting diode structure is disclosed. The hole transport layer of the organic light emitting diode structure is used as a first primary color light emitting layer. A second primary color light emitting unit and a third primary color light emitting unit are formed on the first primary color light emitting layer, and a part of the first primary color light emitting layer is exposed. A method for fabricating the organic light emitting diode structure is also disclosed.

17 Claims, 4 Drawing Sheets

ORGANIC LIGHT EMITTING DIODE STRUCTURE HAVING LIGHT-EMITTING, HOLE TRANSPORT LAYER AND FABRICATING METHOD THEREOF

RELATED APPLICATIONS

This application claims priority to Taiwan Application Serial Number 99115319, filed May 13, 2010, which is herein incorporated by reference.

BACKGROUND

1. Field of Invention

The present invention relates to a structure and fabricating method of an organic light emitting diode. More particularly, the present invention relates to a structure and fabricating method of a full color organic light emitting diode.

2. Description of Related Art

The way in which full color display is achieved on a display device determines the success or failure of the device. Traditional methods used for achieving full color display on an organic light emitting diode (OLED) display can be a three primary color side-by-side method, a White OLED with color filter method, or a color conversion method. The three primary color side-by side method includes arranging the organic light-emitting components of red, green and blued side by side. By mixing the three colored lights generated by those organic light-emitting components, full-color display can be achieved.

However, the individual R, G, B pixels display needs several evaporating steps and mask aiming steps to produce organic light-emitting layers of different colors, which complicates the process and makes the evaporating steps and mask aiming steps more difficult such that the yield decreases and the cost increases.

For the foregoing reasons, how to overcome the yield loss caused by the evaporating and the mask aiming deviation and improve the yield in a full color organic light emitting diode process is very important.

SUMMARY

An object of the invention is to provide a method for fabricating an organic light emitting diode and reduce the risk of evaporating and mask aiming deviation.

An aspect of the invention provides an organic light emitting diode structure, which includes a first electrode, a hole injection layer disposed on the first electrode, a hole transport layer disposed on the hole injection layer and further used as a first primary color light emitting unit, a second primary color light emitting unit disposed on a part of the hole transport layer, a third primary color light emitting unit disposed on a part of the hole transport layer and disposed adjacent to the second primary color light emitting unit, an electron injection layer disposed on the second primary color light emitting unit, the third primary color light emitting unit and a part of the hole transport layer, an electron injection layer disposed on the electron transport layer, and a second electrode disposed on the electron injection layer. The material of the hole transport layer can be a blue light emitting material. The material of the hole transport layer can include a host material and a dopant material. The dopant material can be a green light emitting material or a red light emitting material. The organic light emitting diode structure may optionally include a reflective layer disposed on a surface of the first electrode. The hole transport layer has a flat surface, and the second primary color light emitting unit and the third primary color light emitting unit are disposed on a part of the flat surface. The electron transport layer has a flat surface, and the second primary color light emitting unit and the third primary color light emitting unit are disposed on a part of the flat surface.

Another aspect of the invention provides a method for fabricating an organic light emitting diode. The method includes providing a substrate, forming a first electrode on the substrate, forming a hole injection layer on the first electrode, forming a hole transport layer on the hole injection layer, wherein the hole transport layer is further used as a first primary color light emitting unit, forming a second primary color light emitting unit and a third primary color light emitting unit on a part of the hole transport layer adjacently, forming an electron transport layer on the second primary color light emitting unit, the third primary color light emitting unit, and a part of the hole transport layer, forming an electron injection layer on the electron transport layer, and forming a second electrode on the electron injection layer. The material of the hole transport layer can be a blue light emitting material. The method may optionally include doping a red light emitting material or a green light emitting material in the hole transport layer. The step of forming the second primary color light emitting unit and the third primary color light emitting unit includes using a fine metal mask.

Another aspect of the invention provides a method for fabricating an organic light emitting diode. The method includes providing a substrate, forming a second electrode on the substrate, forming an electron injection layer on the second electrode, forming an electron transport layer on the electron injection layer, forming a second primary color light emitting unit and a third primary color light emitting unit on a part of the electron transport layer adjacently, forming a hole transport layer on the second primary color light emitting unit, the third primary color light emitting unit, and a part of the electron transport layer, wherein the hole transport layer is further used as a first primary color light emitting unit, forming a hole injection layer on the hole transport layer, and forming a first electrode on the hole injection layer. The material of the hole transport layer can be a blue light emitting material. The method optionally includes doping a red light emitting material or a green light emitting material in the hole transport layer. The step of forming the second primary color light emitting unit and the third primary color light emitting unit includes using a fine metal mask.

The hole transport layer is further used as the first primary color light emitting unit. Therefore the conventional three times of the fine metal mask and the evaporating process for fabricating three primary color light emitting units is reduced into two times in the present invention. The evaporating steps are reduces and the risk of mask aiming deviation can also be reduced. The yield in a full color organic light emitting diode process can be improved.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
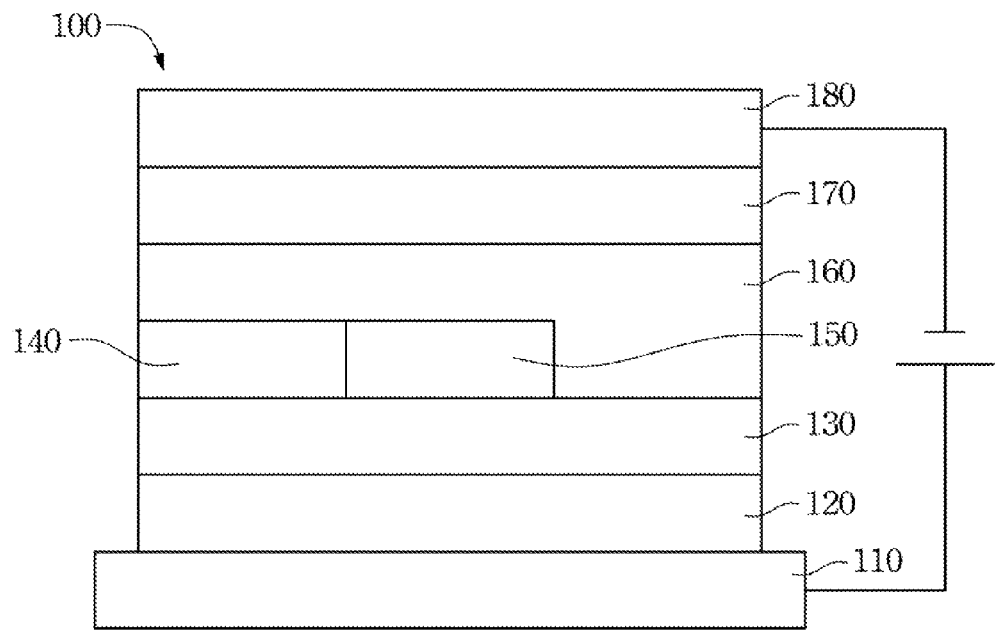
FIG. 1 is a schematic diagram of a first embodiment of the organic light emitting diode structure of the invention.

Reference will now be made in detail to the present embodiments of the invention, examples of which are illustrated in the accompanying drawings. Wherever possible, the same reference numbers are used in the drawings and the description to refer to the same or like parts.

Refer to FIG. 1. FIG. 1 is a schematic diagram of a first embodiment of the organic light emitting diode structure of the invention. The organic light emitting diode structure 100 includes first electrode 110, a hole injection layer 120 disposed on the first electrode 110, a hole transport layer 130 disposed on the hole injection layer 120. The hole transport layer 130 is further used as a first primary color light emitting unit for emitting a light with a wave length of the first primary color. The organic light emitting diode structure 100 further includes a second primary color light emitting unit 140 and a third primary color light emitting unit 150. The second primary color light emitting unit 140 and the third primary color light emitting unit 150 are arranged adjacently and side-by-side on a part of the hole transport layer 130, and another part of the hole transport layer 130 is exposed. The organic light emitting diode structure 100 further includes an electron transport layer 160. The electron transport layer 160 is disposed on the second primary color light emitting unit 140, the third primary color light emitting unit 150, and the part of the exposed hole transport layer 130. The organic light emitting diode structure 100 further includes an electron injection layer 170. The electron injection layer 170 is disposed on the electron transport layer 160. The organic light emitting diode structure 100 further includes a second electrode 180 disposed on the electron injection layer 170. The first electrode 110 is an anode. The second electrode 180 is a cathode. Both the first electrode 110 and the second electrode 180 can be a light emitting side of the organic light emitting diode structure 100.

The hole transport layer 130 being as the first primary color light emitting unit, the second primary color light emitting unit 140, and the third primary color light emitting unit 150 can emit three primary colors to achieve the goal of full-color display. The material of the hole transport layer 130, which is used as the first primary color layer, can be blue light emitting material. More particularly, the material of the hole transport payer 130 is the hole transport material with blue light emitting characteristic, such as 4,4'-Bis(carbazol-9-yl) biphenyl (CBP). The related second primary color light emitting unit 140 and the third primary color light emitting unit 150 would emit red light and green light respectively.

The material of the hole transport unit 130, which is used as the first primary color light emitting unit, can include a host material and a dopant material. The dopant material can be a red light emitting material or a green light emitting material. For example, the host material of the hole transport material can be CBP and further doping 1~10 wt % of red phosphor guest material RD 07 (Universal Display Corporation) or other similar material, therefore the hole transport layer 130 may emit red light. The host material of the hole transport material can be CBP and further doping 1~15 wt % of green phosphor guest material GD33 (Universal Display Corporation) or other similar material, therefore the hole transport layer 130 may emit green light.

The hole transport layer 130 has a flat surface. The hole transport layer 130 is formed on the hole injection layer 120, and the second primary color light emitting unit 140 and the third primary color light emitting unit 150 are formed on the flat surface of the hole transport layer 130.

Figure 2:
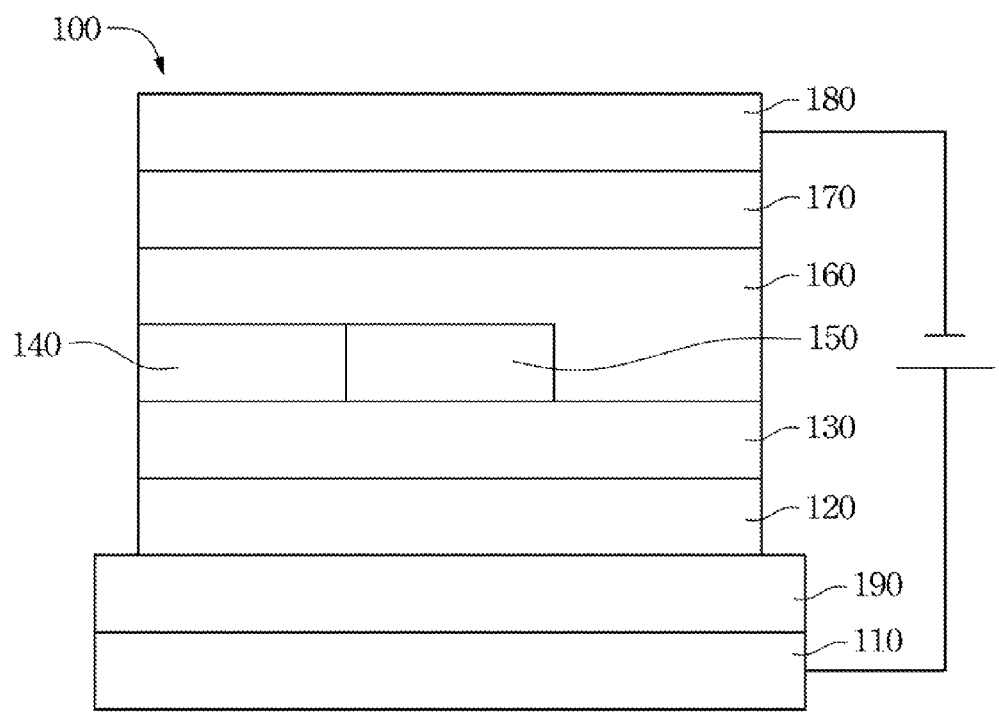
FIG. 2 is a schematic diagram of a second embodiment of the organic light emitting diode structure of the invention.

Refer to FIG. 2. FIG. 2 is a schematic diagram of a second embodiment of the organic light emitting diode structure of the invention. As disclosed above, the hole transport layer 130 is used as the first primary color light emitting unit in this organic light emitting diode structure 100. The material of the hole transport layer 130 can be CBP, which can emit blue light, or the material of the hole transport layer 130 can be CBP doped with red or green light emitting material.

The organic light emitting diode structure 100 may further include a reflective layer 190 disposed on the first electrode 110. The reflective layer 190 is disposed between the first electrode 110 and the hole injection layer 120 in this embodiment. The reflective layer 190 can be disposed on the surface opposite to the hole injection later 120 of the first electrode 110 in other embodiment. The reflective layer 190 may reflect the light toward the second electrode 180, and the second electrode 180 is regarded as the light emitting surface of the organic light emitting diode structure 100.

Figure 3:
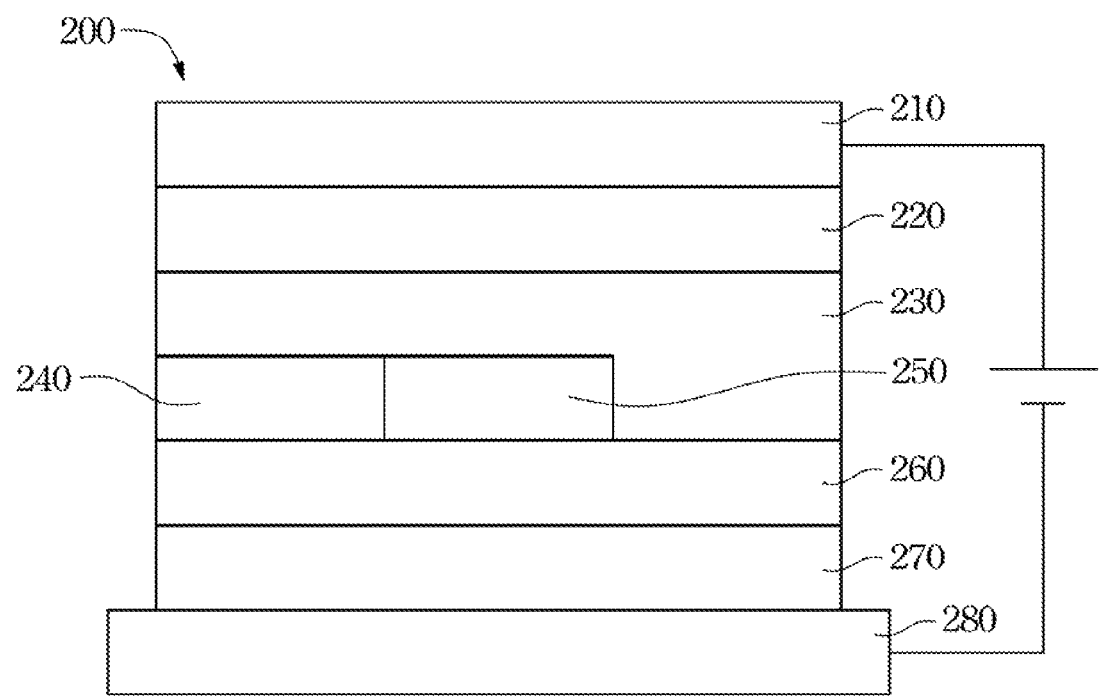
FIG. 3 is a schematic diagram of a third embodiment of the organic light emitting diode structure of the invention.

Refer to FIG. 3. FIG. 3 is a schematic diagram of a third embodiment of the organic light emitting diode structure of the invention. The organic light emitting diode structure 100 includes a second electrode 280, an electron injection layer 270 disposed on the second electrode 280, an electron transport layer 260 disposed on the electron injection layer 270, a second primary color light emitting unit 240 and a third primary color light emitting unit 250 disposed on a part of the electron transport layer 260. The second primary color light emitting unit 240 and the third primary color light emitting unit 250 are arranged adjacently and side-by-side on the part of the electron transport layer 260, and another part of the electron transport layer 260 is exposed. The organic light emitting diode structure 200 further includes a hole transport layer 230 disposed on the second primary color light emitting unit 240, the third primary color light emitting unit 250 and the part of exposed electron transport layer 260. The hole transport layer 230 is further used as a first primary color light emitting unit. The organic light emitting diode structure 200 further includes a hole injection layer 220 disposed on the hole transport layer 230, and a first electrode 210 disposed on the hole injection layer 220.

The first electrode 210 is an anode. The second electrode 280 is a cathode. The material of the hole transport payer 230 is the hole transport material with blue light emitting characteristic, such as 4,4'-Bis(carbazol-9-yl) biphenyl (CBP). The material of the hole transport layer 230 can be CBP doped with red or green light emitting material.

The electron transport layer 260 has a flat surface. The second primary color light emitting unit 240 and the third primary color light emitting unit 250 are formed on the flat surface of the electron transport layer 260. The second primary color light emitting unit 240 and the third primary color light emitting unit 250 are formed the part of the electron transport layer 260 side-by-side, and the hole transport layer 230 is further formed on the second primary color light emitting unit 240, the third primary color light emitting unit 250, and the part of exposed electron transport layer 260.

Figure 4:
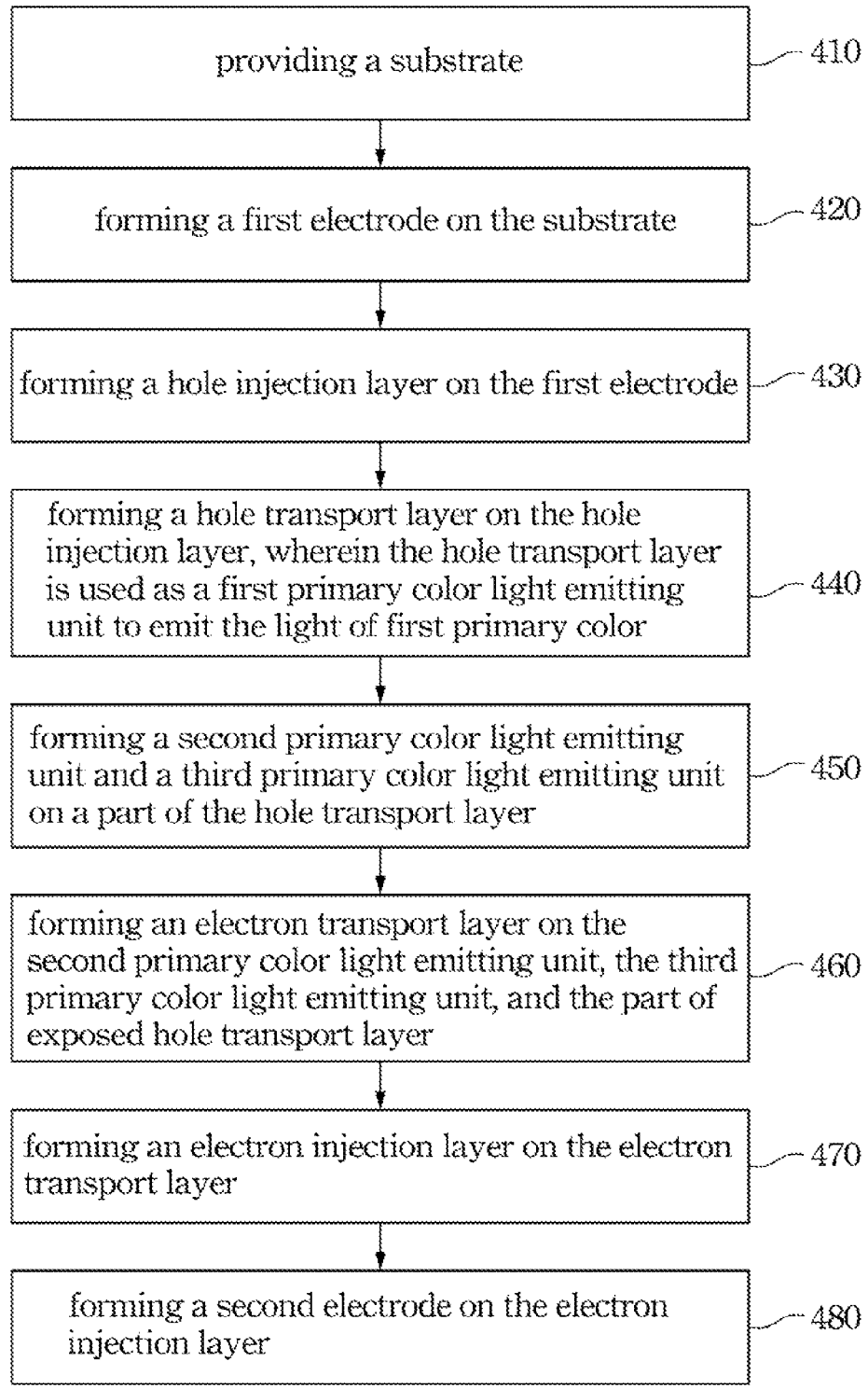
FIG. 4 is a flow chart of a first embodiment of the method for fabricating the organic light emitting diode structure of the invention.

Refer to FIG. 4. FIG. 4 is a flow chart of a first embodiment of the method for fabricating the organic light emitting diode structure of the invention. Step 410 is providing a substrate. Step 420 is forming a first electrode on the substrate. Step 430 is forming a hole injection layer on the first electrode. Step 440 is forming a hole transport layer on the hole injection layer, wherein the hole transport layer is used as a first primary color light emitting unit to emit the light of first primary color.

Step 450 is forming a second primary color light emitting unit and a third primary color light emitting unit on a part of the hole transport layer. The second primary color light emitting unit and the third primary color light emitting unit are arranged side-by-side on the part of the hole transport layer, and another part of the hole transport layer is exposed.

Step 460 is forming an electron transport layer on the second primary color light emitting unit, the third primary color light emitting unit, and the part of exposed hole transport layer. Step 470 is forming an electron injection layer on the electron transport layer. Step 480 is forming a second electrode on the electron injection layer.

In step 440, the material of the hole transport layer can be hole transporting material with blue light emitting characteristics, such as 4,4'-Bis(carbazol-9-yl) biphenyl (CBP). The material of the hole transport unit can include a host material and a dopant material. The dopant material can be a red light emitting material or a green light emitting material. For example, the host material of the hole transport material can be CBP and further doping 1~10 wt % of red phosphor guest material RD 07 (Universal Display Corporation) or other similar material, therefore the hole transport layer may emit red light. The host material of the hole transport material can be CBP and further doping 1~15 wt % of green phosphor guest material GD33 (Universal Display Corporation) or other similar material, therefore the hole transport layer may emit green light.

Step 430, step 440, step 460, and step 470 include using evaporating process or spin coating process. Step 450 of forming the second primary color light emitting unit and the third primary color light emitting unit includes using a fine metal mask. Only two fine metal masks are used when the three primary color light emitting units are formed. The hole transport layer is used as the first primary color light emitting unit, and the fine metal mask for forming the first primary color light emitting unit is omitted. The method may optionally include forming a reflective layer on the substrate or on the first electrode. The first electrode is an anode. The second electrode is a cathode.

Figure 5:
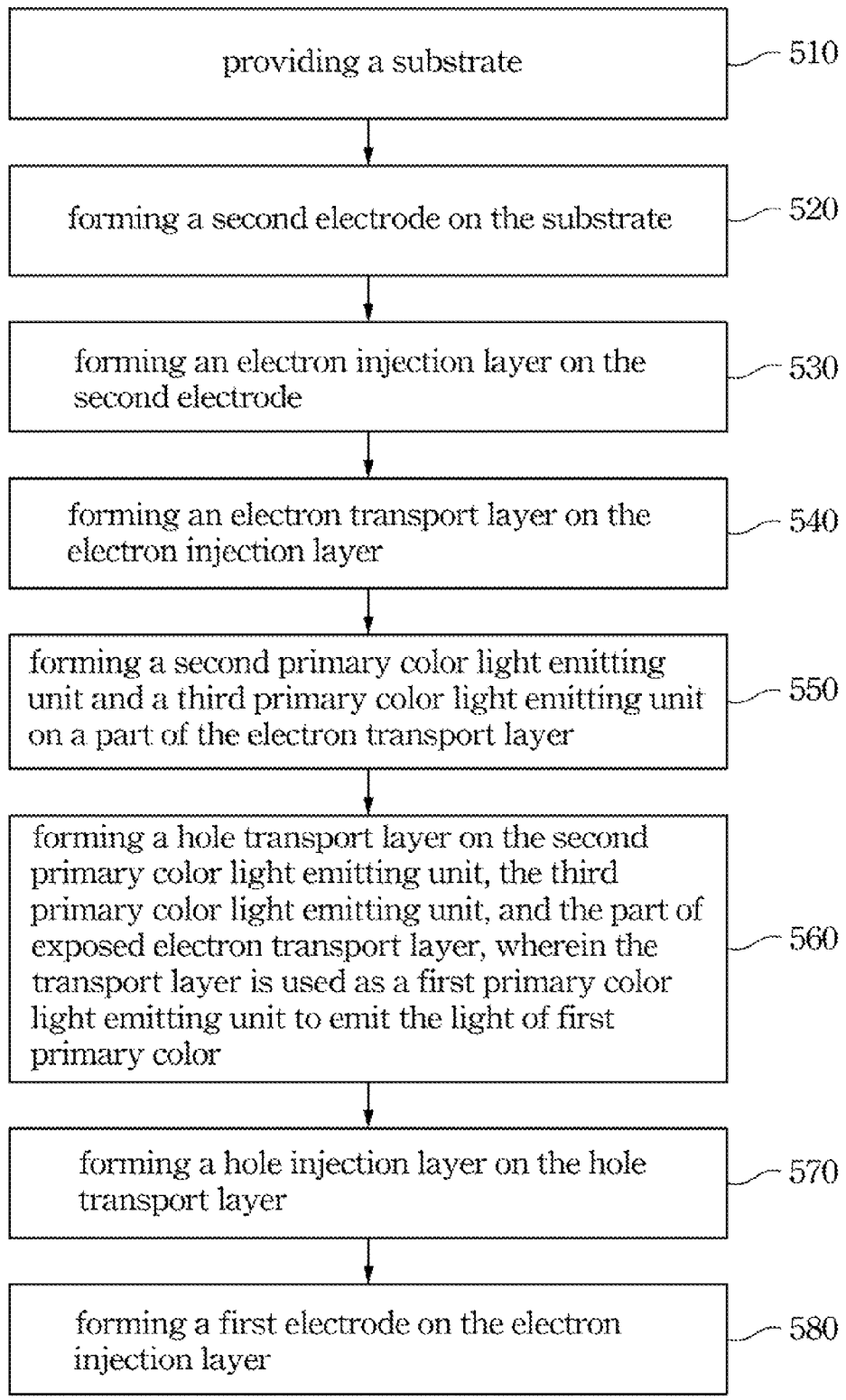
FIG. 5 is a flow chart of a second embodiment of the method for fabricating the organic light emitting diode structure of the invention.

Refer to FIG. 5. FIG. 5 is a flow chart of a second embodiment of the method for fabricating the organic light emitting diode structure of the invention. Step 510 is providing a substrate. Step 520 is forming a second electrode on the substrate. Step 530 is forming an electron injection layer on the second electrode. Step 540 is forming an electron transport layer on the electron injection layer. Step 550 is forming a second primary color light emitting unit and a third primary color light emitting unit on a part of the electron transport layer. The second primary color light emitting unit and the third primary color light emitting unit are arranged side-by-side on the part of the electron transport layer, and another part of the electron transport layer is exposed.

Step 560 is forming a hole transport layer on the second primary color light emitting unit, the third primary color light emitting unit, and the part of exposed electron transport layer, wherein the transport layer is used as a first primary color light emitting unit to emit the light of first primary color. Step 570 is forming a hole injection layer on the hole transport layer. Step 580 is forming a first electrode on the electron injection layer.

In step 560, the material of the hole transport layer can be hole transporting material with blue light emitting characteristic, such as 4,4'-Bis(carbazol-9-yl) biphenyl (CBP). The material of the hole transport unit can include a host material and a dopant material. The dopant material can be a red light emitting material or a green light emitting material. For example, the host material of the hole transport material can be CBP and further doping 1~10 wt % of red phosphor guest material RD 07 (Universal Display Corporation) or other similar material, therefore the hole transport layer may emit red light. The host material of the hole transport material can be CBP and further doping 1~15 wt % of green phosphor guest material GD33 (Universal Display Corporation) or other similar material, therefore the hole transport layer may emit green light.

Step 530, step 540, step 560, and step 570 include using evaporating process or spin coating process. Step 550 of forming the second primary color light emitting unit and the third primary color light emitting unit includes using a fine metal mask. Only two fine metal masks are used when the three primary color light emitting units are formed. The hole transport layer is used as the first primary color light emitting unit, and the fine metal mask for forming the first primary color light emitting unit is omitted. The method may optionally include forming a reflective layer on the substrate or on the first electrode. The first electrode is an anode. The second electrode is a cathode. The material of the first electrode and the second electrode can be transparent electrode, such as ITO or IZO. The material of the first electrode and the second electrode can be metal, such as Ag, Al, Mg, and the alloy thereof.

According to the present embodiments, the invention has following advantages. The hole transport layer is further used as the first primary color light emitting unit. Therefore the conventional three times of the fine metal mask and the evaporating process for fabricating three primary color light emitting unit are reduced into two times in the present invention. The evaporating steps are reduces and the risk of mask aiming deviation can also be reduced. The yield in a full color organic light emitting diode process can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light emitting diode structure comprising:
   a first electrode;
   a hole injection layer disposed on the first electrode;
   a hole transport layer disposed on the hole injection layer, wherein the hole transport layer is further used as a first primary color light emitting unit;
   a second primary color light emitting unit disposed on a part of the hole transport layer;

a third primary color light emitting unit disposed on a part of the hole transport layer and disposed adjacent to the second primary color light emitting unit;

an electron transport layer disposed on the second primary color light emitting unit, the third primary color light emitting unit and a part of the hole transport layer;

an electron injection layer disposed on the electron transport layer; and a second electrode disposed on the electron injection layer;

wherein the second primary color light emitting unit is disposed on and makes physical contact with a first portion of the hole transport layer, wherein the third primary color emitting unit is disposed on and makes physical contact with a second portion of the hole transport layer that is different from the first portion of the hole transport layer, and the third primary color light emitting unit is adjacent to the secondary primary color light emitting unit in a horizontally side-by-side manner, wherein a third portion of the hole transport layer which is different from the first and second portions of the hole transport layer is exposed and not covered by nor vertically aligned with the second and third primary color light emitting units, and wherein the electron transport layer is disposed on and makes physical contact with the second and third primary color light emitting units and is disposed on and makes physical contact with the third portion of the hole transport layer.

2. The organic light emitting diode structure of claim 1, wherein the material of the hole transport layer is a blue light emitting material.

3. The organic light emitting diode structure of claim 1, wherein the material of the hole transport layer comprises a host material and a dopant material.

4. The organic light emitting diode structure of claim 3, wherein the dopant material is a green light emitting material or a red light emitting material.

5. The organic light emitting diode structure of claim 1, further comprising a reflective layer disposed on a surface of the first electrode.

6. The organic light emitting diode structure of claim 1, wherein the hole transport layer has a flat surface, and the second primary color light emitting unit and the third primary color light emitting unit are disposed on a part of the flat surface.

7. The organic light emitting diode structure of claim 1, wherein the electron transport layer has a flat surface, and the second primary color light emitting unit and the third primary color light emitting unit are disposed on a part of the flat surface.

8. The organic light emitting diode structure of claim 1, wherein a projection area of the second primary color light emitting unit or the third primary color light emitting unit is less than a projection area of the first primary color light emitting unit.

9. The organic light emitting diode structure of claim 1, wherein a projection area of the second primary color light emitting unit or the third primary color light emitting unit is less than a projection area of the electron transport layer.

10. A method for fabricating an organic light emitting diode, the method comprising:
providing a substrate;
forming a first electrode on the substrate;
forming a hole injection layer on the first electrode;
forming a hole transport layer on the hole injection layer, wherein the hole transport layer is further used as a first primary color light emitting unit;

forming a second primary color light emitting unit and a third primary color light emitting unit on a part of the hole transport layer adjacently;

forming an electron transport layer on the second primary color light emitting unit, the third primary color light emitting unit, and a part of the hole transport layer;

forming an electron injection layer on the electron transport layer; and forming a second electrode on the electron injection layer;

wherein the second primary color light emitting unit is disposed on and makes physical contact with a first portion of the hole transport layer, wherein the third primary color light emitting unit is disposed on and makes physical contact with a second portion of the hole transport layer that is different from the first portion of the hole transport layer, and the third primary color light emitting unit is adjacent to the second primary color light emitting unit in a horizontally side-by-side manner, wherein a third portion of the hole transport layer which is different from the first and second portions of the hole transport layer is exposed and not covered by nor vertically aligned with the second and third primary color light emitting units, and wherein the electron transport layer is disposed on and makes physical contact with the second and third primary color light emitting units and is disposed on and makes physical contact with the third portion of the hole transport layer.

11. The method of claim 10, wherein the material of the hole transport layer is a blue light emitting material.

12. The method of claim 10, further comprising doping a red light emitting material or a green light emitting material in the hole transport layer.

13. The method of claim 10, wherein the step of forming the second primary color light emitting unit and the third primary color light emitting unit comprises using a metal mask.

14. A method for fabricating an organic light emitting diode, the method comprising:
providing a substrate;
forming a second electrode on the substrate;
forming an electron injection layer on the second electrode;
forming an electron transport layer on the electron injection layer;
forming a second primary color light emitting unit and a third primary color light emitting unit on a part of the electron transport layer adjacently;
forming a hole transport layer on the second primary color light emitting unit, the third primary color light emitting unit, and a part of the electron transport layer, wherein the hole transport layer is further used as a first primary color light emitting unit;
forming a hole injection layer on the hole transport layer; and
forming a first electrode on the hole injection layer;
wherein the second primary color light emitting unit is disposed on and makes physical contact with a first portion of the electron transport layer, wherein the third primary color light emitting unit is disposed on and makes physical contact with a second portion of the electron transport layer that is different from the first portion of the electron transport layer, and the third primary color light emitting unit is adjacent to the second primary color light emitting unit in a horizontally side-by-side manner, wherein a third portion of the electron transport layer which is different from the first and second portions of the hole transport layer is exposed and not covered by nor vertically aligned with the second and third primary color light emitting units, and wherein the hole transport layer is disposed on and makes physical contact with the second and third primary color light emitting units and is disposed on and makes physical contact with the third portion of the electron transport layer.

15. The method of claim 14, wherein the material of the hole transport layer is a blue light emitting material.

16. The method of claim 14, further comprising doping a red light emitting material or a green light emitting material in the hole transport layer.

17. The method of claim 14, wherein the step of forming the second primary color light emitting unit and the third primary color light emitting unit comprises using a metal mask.

* * * * *